(12) United States Patent
Meyer et al.

(10) Patent No.: US 8,217,504 B2
(45) Date of Patent: Jul. 10, 2012

(54) ARTICLE AND PANEL COMPRISING SEMICONDUCTOR CHIPS, CASTING MOLD AND METHODS OF PRODUCING THE SAME

(75) Inventors: Thorsten Meyer, Regensburg (DE); Markus Brunnbauer, Lappersdorf (DE)

(73) Assignee: Intel Mobile Communications GmbH, Neubiberg (DE)

( * ) Notice: Subject to any disclaimer, the term of this patent is extended or adjusted under 35 U.S.C. 154(b) by 898 days.

(21) Appl. No.: 12/047,016

(22) Filed: Mar. 12, 2008

(65) Prior Publication Data
US 2008/0224296 A1    Sep. 18, 2008

(30) Foreign Application Priority Data
Mar. 12, 2007    (DE) .......................... 10 2007 012 155

(51) Int. Cl.
*H01L 23/31* (2006.01)
(52) U.S. Cl. ........ 257/687; 257/723; 257/730; 257/787; 257/684; 257/E21.504; 257/E21.502; 257/E23.178; 257/E23.123
(58) Field of Classification Search .................. 257/687, 257/723, 730, 787, 684, E21.504, E21.502, 257/E23.178, E23.123
See application file for complete search history.

(56) References Cited

U.S. PATENT DOCUMENTS

| | | | |
|---|---|---|---|
| 6,245,595 B1 * | 6/2001 | Nguyen et al. | 438/108 |
| 6,602,734 B1 | 8/2003 | Wada et al. | |
| 6,868,970 B2 | 3/2005 | Gardiner et al. | |
| 7,011,989 B2 | 3/2006 | Becker et al. | |
| 7,037,761 B2 * | 5/2006 | Hedler et al. | 438/127 |
| 7,087,992 B2 * | 8/2006 | Chua et al. | 257/723 |
| 2002/0066694 A1 | 6/2002 | Soh et al. | |
| 2003/0164549 A1 * | 9/2003 | Nakayama | 257/777 |
| 2004/0110323 A1 | 6/2004 | Becker et al. | |
| 2005/0269242 A1 | 12/2005 | Crisp | |

FOREIGN PATENT DOCUMENTS

| | | |
|---|---|---|
| DE | 10324615 A1 | 2/2004 |
| DE | 10250621 A1 | 5/2004 |
| JP | 2004056141 | 2/2004 |

* cited by examiner

*Primary Examiner* — Junghwa M Im
(74) *Attorney, Agent, or Firm* — Edell, Shapiro & Finnan, LLC

(57) ABSTRACT

A panel with a reconfigured wafer including semiconductor chips arranged in rows and columns on semiconductor device positions includes: at least one semiconductor chip having a front, a rear and edge sides provided per semiconductor device position. The reconfigured wafer includes: a front side that forms a coplanar area with the front sides of the at least one semiconductor chip and a plastic housing composition embedding the edge sides and the rear side of the at least one semiconductor chip. The reconfigured wafer includes, on a rear side of the wafer, structures configured to stabilize the panel. The structures are composed of the plastic housing composition and are formed as thickenings of the reconfigured wafer.

10 Claims, 4 Drawing Sheets

ARTICLE AND PANEL COMPRISING SEMICONDUCTOR CHIPS, CASTING MOLD AND METHODS OF PRODUCING THE SAME

CROSS REFERENCE TO RELATED APPLICATIONS

This application claims priority under 35 U.S.C. §119 to Application No. DE 102007012155.7 filed on Mar. 12, 2007, entitled "Article and Panel Comprising Semiconductor Chips, Casting Mold and Methods for Producing the Article and the Panel," the entire contents of which are hereby incorporated by reference.

BACKGROUND

In the production of semiconductor devices, methods have proved to be worthwhile in which first what is known as a reconfigured wafer is produced, in the wafer molding method, from semiconductor chips embedded into a plastic housing composition by their rear side and their edge sides. In this case, the front sides of the semiconductor chips form a coplanar area with the top side of the plastic composition or the front side of the reconfigured wafer. A wiring structure can be applied to the coplanar area very well, wherein the plastic area around the front side of each semiconductor chip can be used for accommodating additional connections or for arranging contact pads having any desired sizes and spacing.

What is problematic about such methods, however, is that they cannot be readily used for producing particularly thin semiconductor devices because reconfigured wafers having a small thickness do not have sufficient stability for the further processing and tend to warp.

SUMMARY

A method for producing semiconductor devices which permits the production of particularly thin semiconductor devices, but which also makes use of the advantages of wafer molding is described herein. Also described herein are an article and a panel comprising semiconductor chips arranged in semiconductor device positions from which particularly thin semiconductor devices can be produced. Furthermore, a casting mold configured to produce such an article and panel is described herein.

In accordance with one aspect, an article comprises a plurality of semiconductor chips and a plate comprising potting material and having a first and a second main surface, wherein the plurality of semiconductor chips are embedded into the potting material and the first main surface includes a projecting structure.

Optionally, the second main surface is planar. In one embodiment, a surface of the plurality of semiconductor chips is uncovered; in particular, an active surface of the plurality of semiconductor chips can be uncovered. In one embodiment, a surface of the plurality of semiconductor chips in the region of the second main surface is uncovered.

In one embodiment, the projecting structure has a predetermined structure height. The projecting structure can include at least one web-type element which, for example, is ring-shaped or grid-shaped and has a common web height. In this case, a common web height is understood to mean that the projecting structure can have a plurality of, including differently shaped, web-type elements which all have the same height above the first main surface. In this case, a web-type element is understood to mean an embodiment of the projecting structure in which the structure is formed in the manner of a web including, for example, a rectangular cross section.

In one embodiment, the plate comprising potting material has a circular contour, for example having the diameter of a semiconductor wafer. The second main surface can comprise at least one wiring layer, wherein the at least one wiring layer can be electrically connected to the semiconductor chips.

According to one aspect, a method for producing an article comprises providing a semiconductor wafer and separating the semiconductor wafer into semiconductor chips, positioning the semiconductor chips on a carrier, and embedding the semiconductor chips in potting material with the formation of a plate comprising potting material and having a first and a second main surface, wherein the first main surface comprises a projecting structure.

In accordance with one aspect, the plate comprising potting material is a panel composed of a reconfigured wafer including semiconductor chips arranged in rows and columns on semiconductor device positions. In accordance with one embodiment, the panel comprises: at least one semiconductor chip having a front side, a rear side and edge sides is provided per semiconductor device position. The reconfigured wafer has a front side that forms a coplanar area with the front sides of the semiconductor chips, and a plastic housing composition embeds the edge sides and the rear sides of the semiconductor chips.

The reconfigured wafer has a rear side on which are arranged projecting structures composed of the plastic housing composition, the structures being configured to stabilize the panel and being formed as thickenings of the reconfigured wafer.

Such a panel has the advantage that it can be very stable despite a small thickness. As a result, it is not necessary for the panel first to be cast with a larger thickness and then to be thinned to a small thickness thereby, a large amount of plastic composition being lost, which constitutes a disadvantage because the material used during wafer molding is comparatively expensive. Moreover, an additional method step is required in this case for the thinning.

The panel is in principle made thin, that is to say, the final thickness of the semiconductor devices is small. However, the panel additionally includes stabilizing structures which project from its surface, which constitute thickenings of the panel and which provide for a sufficient mechanical stability during further processing and prevent warping of the panel.

In an advantageous manner, the panel has a thickness d+t, where: 50 μm≦d+t≦200 μm, in the region of the stabilizing structures and a thickness d, where: 30 μm≦d≦100 μm, in the region outside the stabilizing structures. This ensures that it is sufficiently stable for the processing, but at the same time is also suitable for the production of thin semiconductor devices. In one embodiment, the panel has the form and dimensions of a wafer.

Depending on the embodiment of the stabilizing structures, the latter are concomitantly removed automatically when the panel is singulated into semiconductor devices, without a dedicated method step being required for this purpose. The stabilizing structures are advantageously arranged as follows for this purpose: the panel includes first regions on its top side and its underside, which form top sides and undersides of semiconductor devices after the panel has been singulated to form semiconductor devices. The panel further includes second regions, which are removed during, before or after the singulation and are not provided for forming top sides or undersides of semiconductor devices. The stabilizing structures are arranged in the second regions.

In a further embodiment, the stabilizing structure is formed as a ring. This is advantageous in particular if the panel has the form and dimensions of a wafer. The ring is then seated on the edge of the wafer and encloses the zone with the semiconductor device positions arranged in rows and columns. Consequently, the ring-shaped thickening is not arranged over semiconductor chips and the thickened edge can therefore be discarded in a simple manner when the wafer is singulated into semiconductor devices.

In a further embodiment, the stabilizing structure is formed as a cross. In this case, the cross can also be arranged in addition to the ring on the rear side of the panel. In an advantageous manner, it is arranged centrally on the panel and extends over the whole available area, i.e., the length of its two bars substantially corresponds to the whole length of the panel in the two directions. In this case, it is expedient for the two bars of the cross to be arranged parallel to the rows and columns of the semiconductor device positions.

This is because with such an arrangement it is possible for the cross not to be arranged above semiconductor chips and for the material that forms the cross to be provided as sacrificial material just like the material of the ring and for it to be discarded in a simple manner during the sawing process for singulating the panel into a plurality of semiconductor devices. As an alternative, it is also possible for the stabilizing structure to be removed directly prior to singulation by thinning the panel. Although this requires a dedicated method step, the amount of material discarded during thinning is not as much as in the conventional method, in which the reconfigured wafer has to be thinned over its entire area.

In a further embodiment, the stabilizing structure is formed as a grid, wherein the grid is formed by thickenings of the panel in regions provided as sawing tracks. This embodiment can likewise be combined with the first or else with the second embodiment. It has the advantage that the material of the stabilizing structures is automatically removed during the sawing process for singulating the panel since it is arranged directly in the sawing tracks. Moreover, the grid-shaped structure enables a particularly uniform stabilization of the panel during the processing.

In one embodiment, a single- or multilayer wiring structure with conductor tracks is arranged on the surface of the panel. Accordingly, the wiring structure can be applied particularly well because warping is prevented or at least greatly reduced by the stabilizing structure. Photolithographic processes can therefore be carried out without any problems even though a thin panel is employed.

A thermoplastic or a thermosetting plastic which can be processed by injection molding or molding is advantageously provided as plastic housing composition.

In one embodiment, the semiconductor chips comprise active regions with integrated circuits on their front sides. As an alternative, active regions can also be arranged on the rear side of the semiconductor chips or on the front side and on the rear side.

According to a further aspect, a casting mold for embedding semiconductor chips into a plastic housing composition for producing a panel comprises an upper part and a lower part, wherein the upper part and the lower part enclose a cavity with their inner sides. The cavity is formed to receive the semiconductor devices to be embedded. The upper part comprises cutouts on its inner side.

In this case, the cutouts are configured to producing the stabilizing structure on the rear side of the panel. Consequently, depending on the embodiment of the panel, the cutouts can be formed as a ring, as a cross or as a grid. Since the inner side of the upper part of the casting mold is a negative of the rear side of the panel, shaped portions which form the stabilizing structure are produced on the rear side of the panel with the aid of the cutouts.

The depth of the cutouts depends on the final small thickness d of the panel and on the desired stabilization effect. The stabilizing structures advantageously have a depth t, where: $20\ \mu m \leq t \leq 100\ \mu m$.

The upper part of the casting mold comprises, for example, metal, silicon or plastic.

The casting mold has the advantage that the stabilizing structures are impressed on the panel as early as during the casting or molding process. This method step is necessary anyway for embedding the semiconductor chips; for impressing the stabilizing structures it is merely necessary for the casting mold to be adapted somewhat, such that it includes the cutouts. Thus, the production of a very thin but nevertheless stable panel is possible in a very simple manner without additional method steps.

A method for producing a panel including semiconductor devices arranged in rows and columns on semiconductor device positions comprises: first, providing a semiconductor wafer and separating the wafer into a plurality of semiconductor chips having front, rear and edge sides. The semiconductor chips are positioned by their front sides on the top side of a carrier, wherein the semiconductor chips are separated from one another by interspaces.

Subsequently introducing the carrier into a casting mold, wherein the casting mold comprises an upper part and a lower part, which enclose a cavity with their inner sides, wherein the upper part comprises cutouts on its inner side and wherein the carrier is positioned by its rear side on the inner side of the lower part.

Subsequently embedding the semiconductor chips by their rear sides and their edge sides into a plastic housing composition with the formation of a panel composed of a reconfigured wafer, wherein the panel includes a front side that forms a coplanar area with the front sides of the semiconductor chips. The embedding is effected with shaped portions that form structures that stabilize the panel being impressed into a rear side of the panel via the cutouts in the inner side of the upper part of the casting mold.

The cutouts in the inner side of the upper part of the casting mold are formed, for example, as a ring and impress a ring on the panel as stabilizing structure. However, they can also be formed as a cross or grid and impress a cross or grid on the panel as stabilizing structure. Moreover, depending on the arrangement of the semiconductor chips in the panel and depending on the desired stabilization effect, other forms, including irregular forms, are conceivable for the stabilizing structures.

After the production of the panel provided with the stabilizing structures, the panel is separated into semiconductor devices by sawing along sawing tracks. During this process, stabilizing structures can be separated or removed by the sawing itself if they are situated in the sawing tracks.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Various exemplary embodiments are explained in more detail below with reference to the accompanying figures, where.

Identical parts are provided with the same reference symbols in all of the figures.

DETAILED DESCRIPTION

Figure 1:
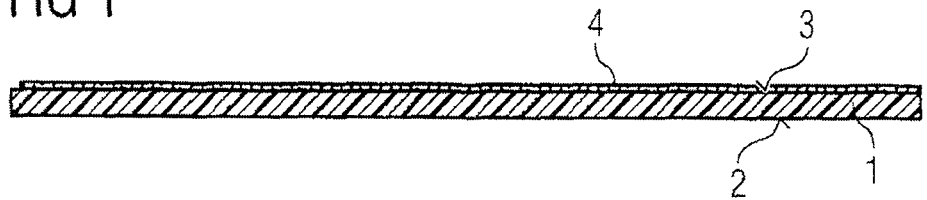
FIG. 1 schematically shows a first step of a method for producing a panel.

FIG. 1 shows a first step of a method for producing a panel. The first step involves providing a carrier 1 having an underside 2 and a top side 3. An adhesive film 4 is applied to the top side 3. The adhesive film 4 is typically adhesive and strippable on both sides, for example, by additional action of heat or radiation.

Figure 2:
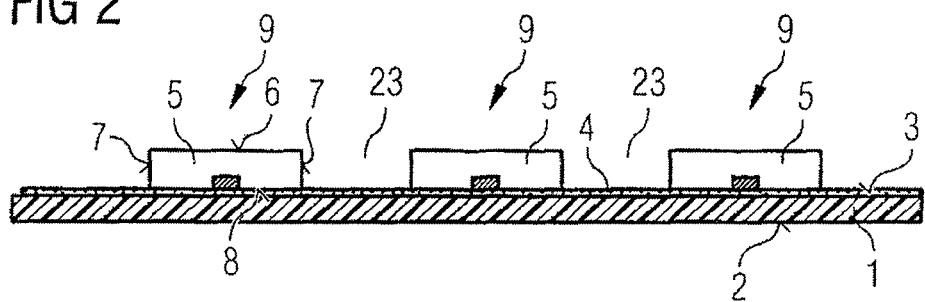
FIG. 2 schematically shows a further step of the method for producing a panel.

In a further step of the method, which is illustrated in FIG. 2, semiconductor chips 5 which had been singulated from a semiconductor wafer and tested beforehand with regard to their function are arranged, by "pick and place" methods, by their front side 8 on the top side 3 of the carrier 1 provided with the adhesive film 4. The semiconductor chips 5 have integrated circuits on their front side 8. The rear side 6 and the edge sides 7 of the semiconductor chips 5 are typically passive, that is to say that they have no integrated circuits.

The semiconductor chips 5 are arranged in rows and columns on semiconductor device positions 9. Interspaces 23 are left free between them.

Figure 3:
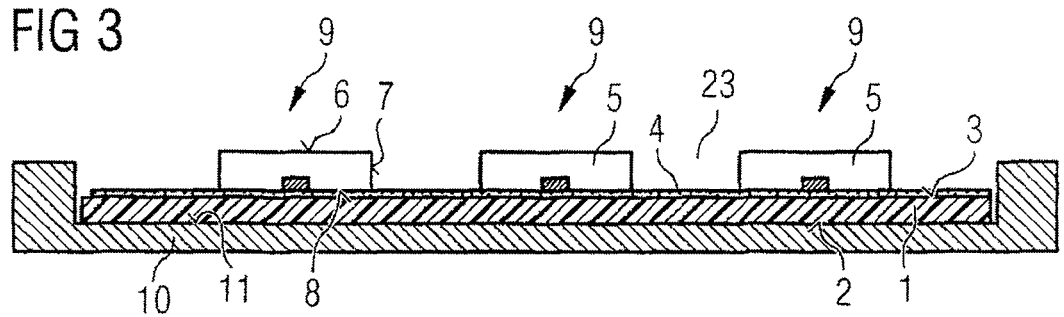
FIG. 3 schematically shows a further step of the method for producing a panel.

FIG. 3 shows a further step of the method, in which the carrier 1 together with the semiconductor chips 5 arranged on its top side 3 is introduced into the lower part 10 of a casting mold.

Figure 4:
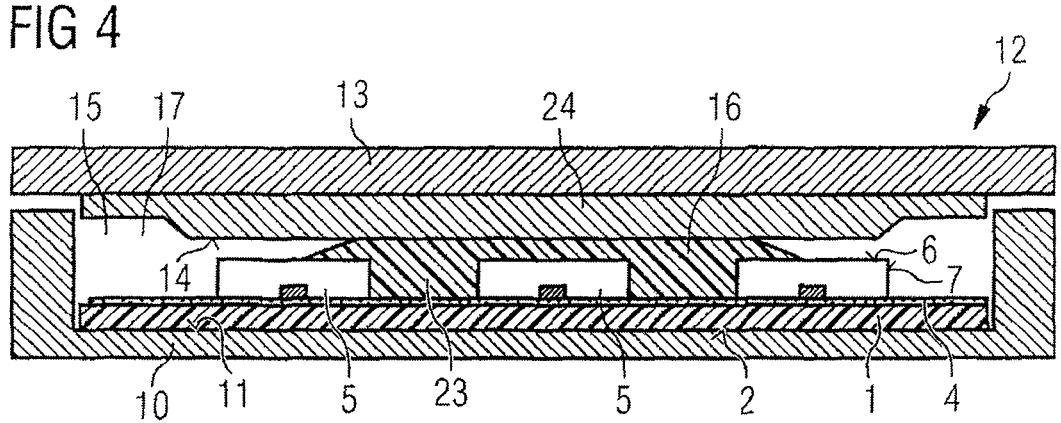
FIG. 4 schematically shows a further step of the method for producing a panel.

The casting mold 12 is illustrated schematically in FIG. 4. It comprises an upper part 13 and a lower part 10. The upper part 13 and the lower part 10 enclose a cavity 15 with their inner sides 14 and 11, respectively. The carrier 1 with the semiconductor chips 5 is arranged in the cavity in order to embed the semiconductor chips 5 into a plastic housing composition 16.

The upper part 13 of the casting mold 12 has cutouts 17 on its inner side 14. The cutouts 17 can also be introduced into an insert 24 of the casting mold 12, which can be exchangeable, for example. During casting or molding, the plastic housing composition 16 is introduced into the cavity 15 in a comparatively liquid state; the casting mold 12 is closed with the semiconductor chips 5 being embedded into the plastic housing composition 16 by their rear sides 6 and edge sides 7. The interspaces 23 are also filled with plastic housing composition 16, during the process. After the curing of the plastic, the finished panel is removed from the casting mold 12. It then has the form of a reconfigured wafer composed of plastic housing composition 16 with semiconductor chips 5 embedded therein. In this case, the active front sides 8 of the semiconductor chips 5 form a coplanar area with the front side 20 of the panel 18.

Figure 5:
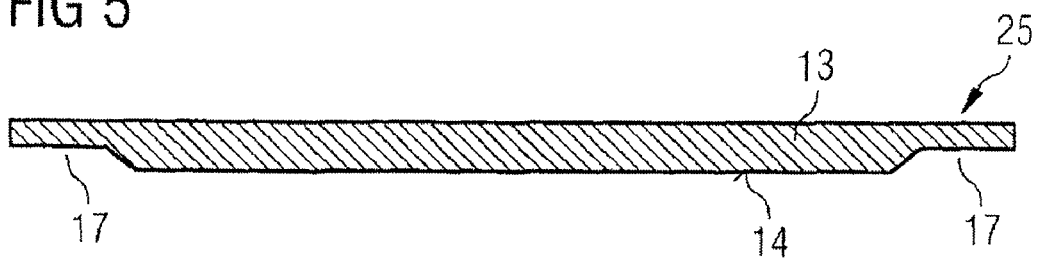
FIG. 5 schematically shows a first embodiment of the upper part of a casting mold.
Figure 6:
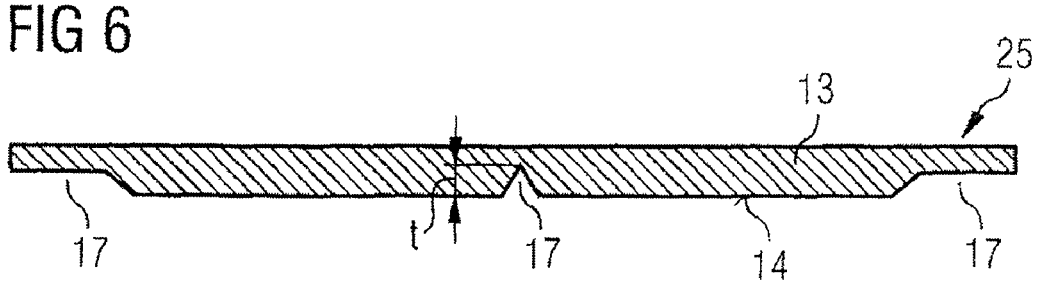
FIG. 6 schematically shows a second embodiment of the upper part of the casting mold.
Figure 7:
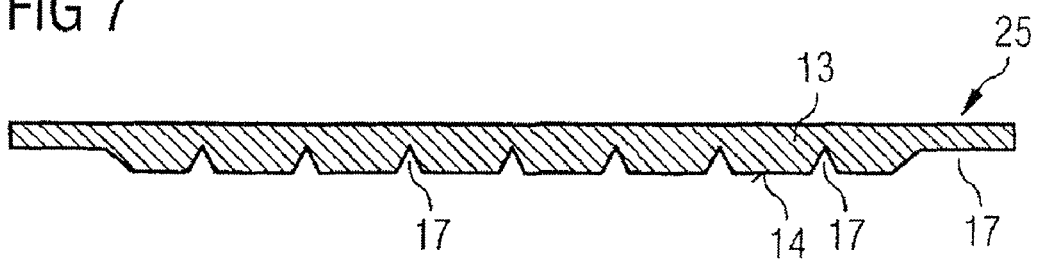
FIG. 7 schematically shows a third embodiment of the upper part of the casting mold.

FIGS. 5 to 7 show for example possible embodiments of the upper part 13 or of the insert 24 of the casting mold 12.

FIG. 5 schematically illustrates, in cross section, an embodiment in which the upper part 13 of the casting mold comprises a ring-shaped cutout 17 in its edge region 25. The cutout is formed in such a way that the upper part 13 has a smaller thickness in its edge region than in its center. Since the rear side of the cast panel represents a negative impression of the upper part 13 of the casting mold, a cutout such as the one shown in FIG. 5 produces a ring-shaped thickening in the edge region of the panel.

FIG. 6 schematically illustrates, in cross section, an embodiment in which the upper part 13 of the casting mold also has a cross-shaped cutout 17 in its center in addition to the ring-shaped cutout. In this case, in order to provide particularly good stabilization, the two bars of the cross, of which only the cutout for one bar can be seen in this view, run the entire width and length of the panel.

FIG. 6 also reveals that the cutouts have a depth t. In this case, it is also possible for the cutouts to have different depths (i.e., t does not have the same value at all locations).

FIG. 7 schematically shows in cross section an embodiment in which the upper part 13 of the casting mold also comprises grid-shaped cutouts 17 in its center in addition to the ring-shaped cutout in the edge region 25.

FIGS. 8 to 12 schematically show panels 18 produced with the aid of the casting molds shown.

Figure 8:
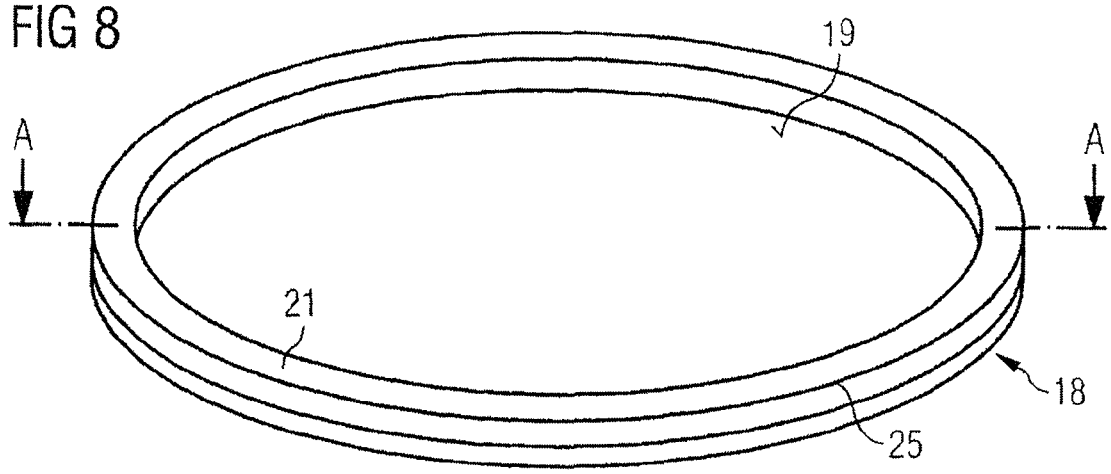
FIG. 8 schematically shows a first embodiment of a panel.
Figure 9:
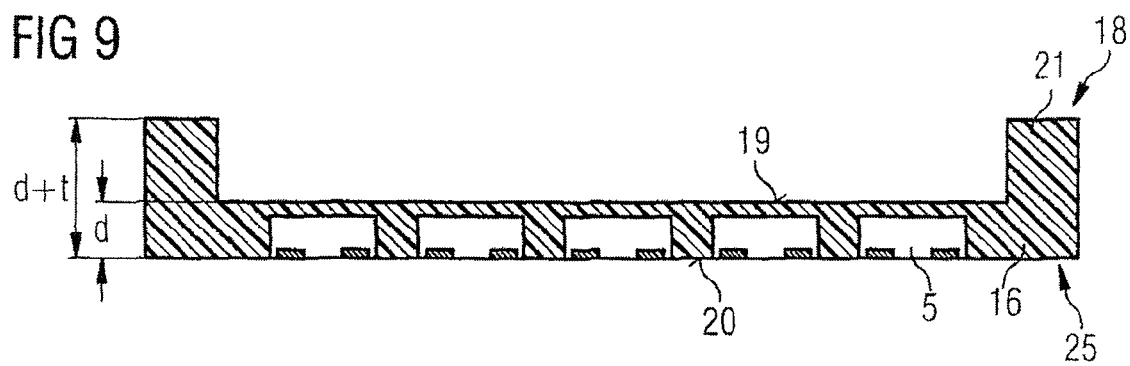
FIG. 9 schematically shows a cross section through the panel in accordance with FIG. 8.

The panel 18 in accordance with FIG. 8 has a ring-shaped thickening 21 in its edge region 25 on its rear side 19. FIG. 9 shows a cross sectional view of the panel 18 in accordance with FIG. 8 along the section A-A. This view reveals how the semiconductor chips 5 are embedded in the plastic housing composition 16.

The panel 18, which in this exemplary embodiment has the form and dimensions of a wafer, has a thickness d where 30 $\mu m \leq d \leq 100$ $\mu m$. In its edge region 25, in which the ring-shaped thickening 21 is arranged, however, its thickness is increased by t, where: 50 $\mu m \leq d+t \leq 200$ $\mu m$. The stabilizing structure therefore rises as a thickening 21 by t above the rear side 19 of the panel 18.

Figure 10:
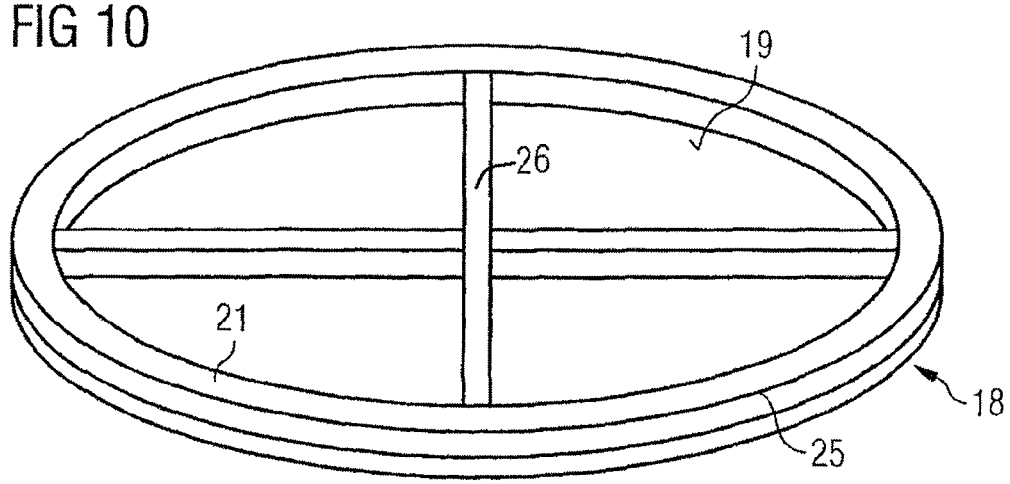
FIG. 10 schematically shows a second embodiment of the panel.

FIG. 10 shows a further embodiment of the panel 18, in which there is arranged not only the ring-shaped thickening 21 in the edge region 25 of the panel 18, but in addition also a cross-shaped thickening 26 in the center of the panel 18. In this case, the panel 18 can likewise have the thickness d+t in the region of the cross-shaped thickening 26. However, it is also possible for it to have the thickness d+t' there, where: t≠t' holds true.

Figure 11:
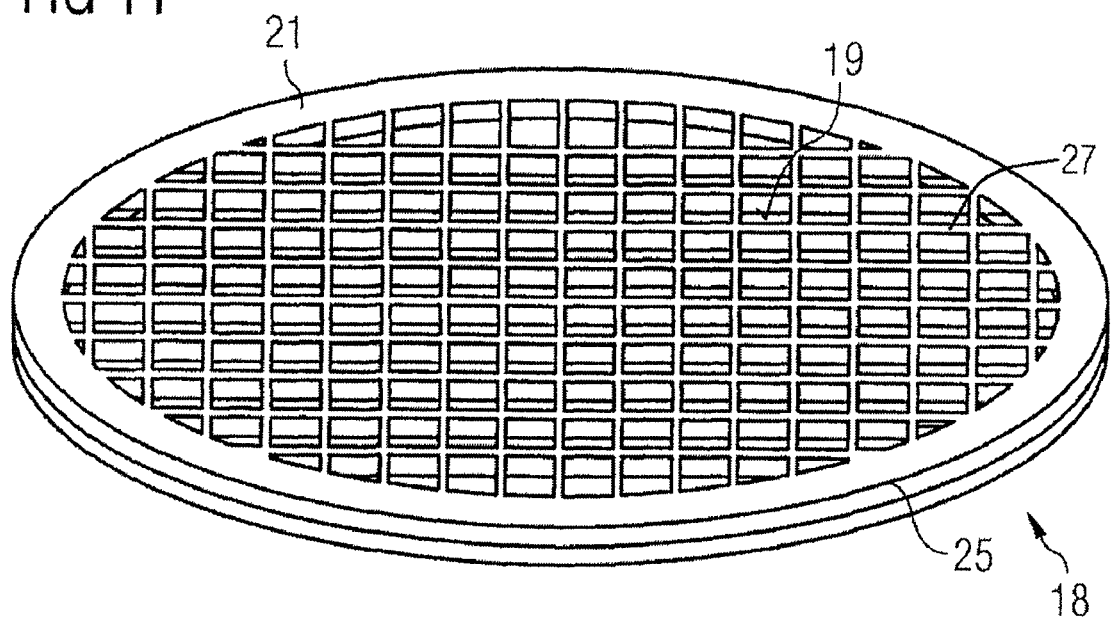
FIG. 11 schematically shows a third embodiment of the panel.

FIG. 11 shows a further exemplary embodiment of the panel 18 with the stabilizing structure. In this exemplary embodiment, the panel 18 likewise has the ring-shaped thickening 21, but in addition also a grid-shaped thickening 27. In this case, the individual bars forming the grid are advantageously arranged in sawing tracks, such that they are automatically removed when the panel 18 is singulated into semiconductor devices.

Figure 12:
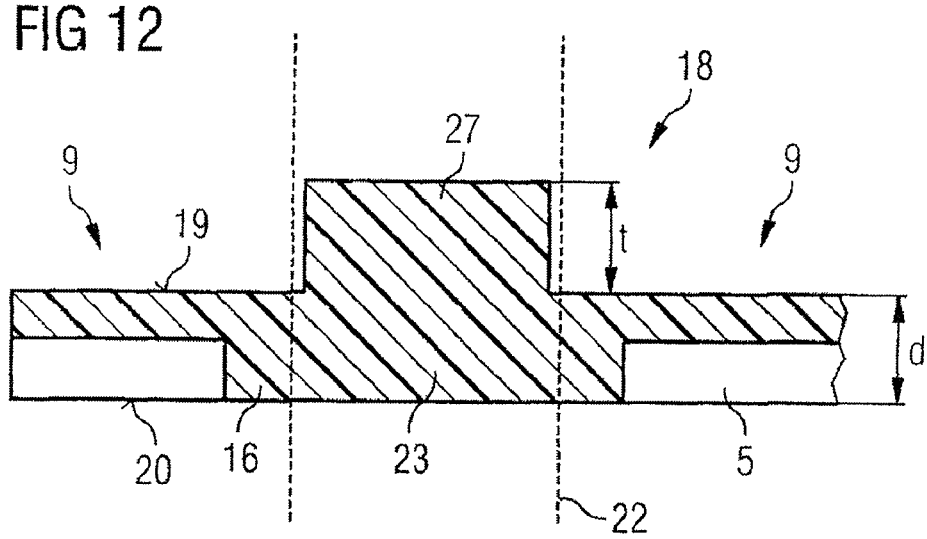
FIG. 12 schematically shows an excerpt from the panel in accordance with FIG. 11.

FIG. 12 shows this structure in detail. The illustration shows an individual bar of the thickening 27, which is arranged above an interspace 23 between two semiconductor chips 5. The dashed lines 22 identify a sawing track. The thickening 27 is formed in such a way that it is completely covered by the sawing track, such that it is completely removed when the panel 18 is singulated into semiconductor devices.

In this exemplary embodiment, too, the thickenings 27 have the thickness d+t, just like the thickening 21. However, it is also possible for them to have the thickness d+t', where: t≠t' holds true. In particular, the stabilizing structure can be thicker in the edge region than in the center of the panel, that is to say t>t' can hold true.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An article, comprising:
    at least two semiconductor chips; and
    a plate comprising potting material and having first and second main surfaces, the first main surface including a ring-shaped projecting structure disposed in an edge region of the plate, the ring-shaped projecting structure extending perpendicularly from a planar portion of the first main surface such that the plate has a greater thickness in the edge region than in an entirety of an interior region of the plate;
    wherein the at least two semiconductor chips are embedded into the potting material in the interior region of the plate.

2. The article according to claim 1, wherein the second main surface is planar and active surfaces of the at least two semiconductor chips are coplanar with the second main surface.

3. The article according to claim 1, wherein a surface of each of the at least two semiconductor chips is uncovered.

4. The article according to claim 1, wherein an active surface of each of the at least two semiconductor chips is uncovered.

5. The article according to claim 1, wherein a surface of each of the at least two semiconductor chips in the region of the second main surface is uncovered.

6. The article according to claim 1, wherein the plate comprising potting material has a circular shape.

7. A panel including a reconfigured wafer with semiconductor chips arranged in rows and columns in semiconductor device positions in an interior region of the reconfigured wafer, the panel comprising:
    at least one semiconductor chip per semiconductor device position, the at least one semiconductor chip having a front side, a rear side and edge sides, the reconfigured wafer having a front side that forms a coplanar area with the front sides of the semiconductor chips; and
    a plastic housing composition embedding the edge sides and the rear sides of the semiconductor chips;
    wherein the reconfigured wafer includes a ring-shaped projecting structure configured to stabilize the panel and arranged in an edge region on a rear side of the reconfigured wafer, the ring-shaped projecting structure comprising the plastic housing composition and extending perpendicularly from a planar portion of the rear side such that the reconfigured wafer has a greater thickness in the edge region than in an entirety of the interior region.

8. The panel according to claim 7,
    wherein the panel has a thickness in the edge region of the reconfigured wafer of d+t, where: 50 μm d+t ≦200 μm, and a thickness in the interior region of d, where: 30 μm ≦d ≦100 μm.

9. The panel according to claim 7, wherein the panel has the form and dimensions of a wafer.

10. The panel according to claim 7, further comprising:
    a wiring structure with conductor tracks arranged on the front side of the panel, the wiring structure being a single layer or multilayer wiring structure.

* * * * *